United States Patent [19]

Eron

[11] Patent Number: 4,687,730

[45] Date of Patent: Aug. 18, 1987

[54] LIFT-OFF TECHNIQUE FOR PRODUCING METAL PATTERN USING SINGLE PHOTORESIST PROCESSING AND OBLIQUE ANGLE METAL DEPOSITION

[75] Inventor: Murat Eron, South Brunswick Township, Mercer County, N.J.

[73] Assignee: RCA Corporation, Princeton, N.J.

[21] Appl. No.: 792,790

[22] Filed: Oct. 30, 1985

[51] Int. Cl.⁴ .................... G03F 7/26; H01L 21/44; G03C 5/00

[52] U.S. Cl. ................................ 430/324; 430/313; 430/314; 430/315; 430/326; 430/328

[58] Field of Search ............... 430/324, 312, 313, 314, 430/315, 328, 326

[56] References Cited

U.S. PATENT DOCUMENTS

| | | | |
|---|---|---|---|
| 3,653,898 | 4/1972 | Shaw | 430/312 |
| 3,982,943 | 9/1976 | Feng et al. | 430/314 |
| 4,093,503 | 6/1978 | Harris et al. | 156/628 |
| 4,293,624 | 10/1981 | Buckley | 430/314 |
| 4,377,633 | 3/1983 | Abrahamovich et al. | 430/314 |
| 4,394,437 | 7/1983 | Bergendahl et al. | 430/313 |
| 4,525,919 | 7/1985 | Fabian | 29/571 |
| 4,529,686 | 7/1985 | Kraus | 430/314 |

Primary Examiner—Charles L. Bowers, Jr.
Attorney, Agent, or Firm—Joseph S. Tripoli; Fred Jacob; Henry I. Steckler

[57] ABSTRACT

A process of forming sub-micrometer metallization structures on a substrate is provided. A layer of a photoresist on the structure is pattern irradiated with a reduced dosage of actinic radiation so that, upon development, recesses are formed therein which extend only partially through the photoresist layer. A first layer of metallization is deposited onto the structure at an oblique angle such that it does not completely coat the photoresist in the recesses. The structure is then flood irradiated with actinic light and developed to form openings to the substrate where the photoresist layer is not covered in the recesses. A second layer of metallization is then deposited at normal incidence. The second metallization breaks off and deposits isolated structures on the substrate through the openings. The photoresist layer and overlying layers of metallization are then removed by conventional lift-off technique.

10 Claims, 5 Drawing Figures

LIFT-OFF TECHNIQUE FOR PRODUCING METAL PATTERN USING SINGLE PHOTORESIST PROCESSING AND OBLIQUE ANGLE METAL DEPOSITION This invention relates to an improvement in the formation of an extremely fine patterned layer of a material, particularly a metal, onto a substrate using lift-off techniques.

BACKGROUND OF THE INVENTION

In the fabrication of electronic devices, it is frequently necessary to provide a patterned layer of a metallic conductor which functions, e.g. as an interconnection among a plurality of devices on a substrate, as a gate electrode for a field effect transistor (FET), and the like. One method of forming a patterned layer of metallization is to coat the entire substrate and then wet or dry etch away a portion of the coating, leaving only the desired pattern. This method suffers from a number of art-recognized disadvantages. An alternative is the use of lift-off technique.

Conventional lift-off structures comprise a lift-off layer and at least one overlying resist layer. Upon irradiation and development, the lift-off layer must undercut the resist layer, ideally to a predictable degree. The resultant profile of the structure must be such that a layer of metallization deposited thereover will break off at the openings in the resist structure and deposit in the bottom thereof on the substrate with sufficient clearance to the sidewalls to enable a solvent to penetrate to the substrate and cause the lift-off layer to separate. It is difficult to produce the resist profile necessary for lift-off with the reproducibility essential for commercial use. There have been a number of varied approaches to achieving this object. None can be categorized as being eminently successful.

The problem of developing a successful lift-off technique is heightened by the demand to reduce the width of isolated metal structures formed thereby to one micrometer and, preferably, less than one micrometer. Submicrometer dimensions are desirable to increase the number of devices in a given area of substrate surface and, in the instance of an FET, increase the operating efficiency of the device. It is recognized by those of ordinary skill in the art that decreasing the width of the gate electrode of an FET permits an increase in the maximum operating frequency of the device.

The formation of patterns of metallization of sub-micrometer dimension by combining lift-off with the oblique deposition of a metal layer is disclosed in Fabian, U.S. Pat. No. 4,525,919, issued July 2, 1985 and Kraus, U.S. Pat. No. 4,529,686, issued July 16, 1985. The processes disclosed therein, however, are complex and involve multiple layers of various materials to form a resist structure suitable for lift-off. In accordance with this invention, there is provided a process for deposition of sub-micrometer metallization which is advantageous in that it is comparatively simple and requires only a single layer of resist material.

SUMMARY OF THE INVENTION

Sub-micrometer lines of metallization are formed in accordance with this invention by pattern irradiating a layer of positive photoresist formed over a substrate with an irradiation dosage such that, upon development, there are formed recesses which extend only partially through the thickness of the photoresist layer. A thin layer of a suitable metallization is deposited onto the photoresist layer at an angle such that it does not completely coat the surface of the recesses formed in the photoresist layer. The structure is then flood irradiated and developed to remove the remaining thickness of the photoresist layer in the recesses which is not covered by the metallization layer. Using the first metallization layer as a mask, a second layer of metallization is deposited onto the structure at normal incidence. The photoresist layer is removed with a suitable organic solvent leaving only the second metallization deposited on the substrate through the openings in the first metallization layer.

DETAILED DESCRIPTION OF THE INVENTION

The substrate receiving a sub-micrometer patterned layer of metallization in accordance with this invention may be any suitable material, for example, gallium arsenide, single crystalline silicon, tungsten, polycrystalline materials with suitable surfaces, vitreous materials or the like. The substrate may be appropriately doped to provide regions of varying conductivity. Preferred substrates are gallium arsenide or single crystal silicon wafers. The substrate may contain topographical features which, typically, may be devices, device subassemblies, silicon islands, mesas, circuit components and the like. These features may be the same as or of a material different than that of the substrate. The exact nature of such features, when present, is not critical to the invention.

Figure 1:
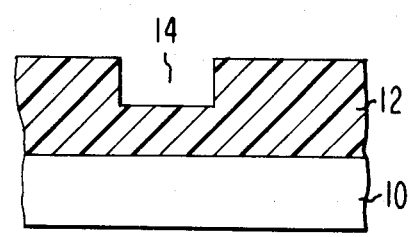
FIGS. 1–5 are cross-sectional views illustrating the process of this invention.

Referring to FIG. 1, the substrate 10 is initially coated with a layer of a positive photoresist 12. The choice of a photoresist is not critical to the subject method. It will be appreciated, however, that the photoresist should have planarizing capabilities in the event that the substrate has topographical features. Suitable photoresist preparations include, for example, novolac resin/diazoquinone sensitizer-based photoresist compositions such as IPR 25 of Baker Chemical Company, HPR 204 and HPR 206 of Philip A. Hunt Chemical Co., Microposit 1400-30 of the Shipley Co., AZ 1350J-SF of American Hoechst Corporation, Kodak 800 of Eastman Kodak, OFPR of Dynachem Corporation and the like.

The photoresist composition is applied to the substrate by any conventional technique, suitably by spin-coating, dried and soft-baked as recommended by the manufacturer. The layer of photoresist is suitably from about 800 to about 1500, preferably from about 1000 to about 1200, nanometers thick.

The photoresist layer is then pattern irradiated with actinic radiation in an amount such that, upon development, only a portion of the thickness of the photoresist layer will be removed to form a recess 14. Suitably, from about 5 to about 15, preferably about 10, percent of the conventional irradiation dosage is utilized. The photoresist layer is developed utilizing the developer recommended by the manufacturer, typically an aqueous alkaline preparation. The conditions of the development are modified to insure that the photoresist layer is not overdeveloped. For example, the time for development, i.e. the time in which the photoresist layer is exposed to the developer can be reduced to from about 10 to 15 percent of that recommended, or the developer itself can be diluted with deionized water to from about 1:4 to about 1:50 of the original volume. It is contemplated that from about 25 to 50, suitably about 30, percent of the original thickness of the photoresist layer will be removed in the development step to form recesses 14 which extend only partially through the photoresist layer 12 as shown in FIG. 1 which illustrates a single such opening in magnified cross-section.

The photoresist layer is then hard baked as recommended by the manufacturer. If desired, the surface of the photoresist may be toughened in preparation for metal deposition, suitably by a conventional technique such as a brief blanket irradiation in a fluorocarbon plasma, for example, carbon tetrafluoride in a mixture of helium and nitrogen with a minor percentage of oxygen.

Figure 2:
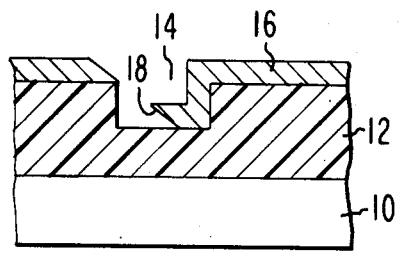

A thin layer of metallization 16, suitably a metal which can easily be chemically removed, for example, titanium or nickel, is then deposited onto the structure at an oblique angle, typically 45° from normal. Deposited in this manner, the first metallization layer 16 does not completely cover the bottom of the recess 14 as shown in FIG. 2. There remains an opening in the metallization coating 16 which can be calculated according to the equation:

$$x = a - t \cdot \sin A - d \cdot \tan A$$

wherein x is the width of the opening, a is one unit of measure in the dimensions of t and d, t is the length of surface 18 in FIG. 2, d is the depth of the recess 14 and A is the angle of deposition of the metallization. Thus, when the metallization is deposited at a 45° angle from normal, a is one micrometer, t is 0.11 micrometer and d is 0.62 micrometer, the opening x is 0.3 micrometer. The metallization layer is suitably from about 50 to about 150, preferably about 100, nanometers thick, measured on a vertical thickness.

Figure 3:
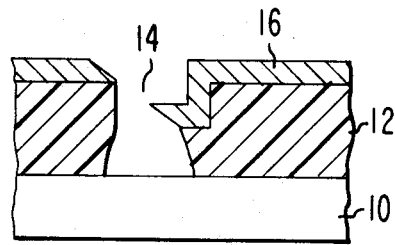
Figure 4:
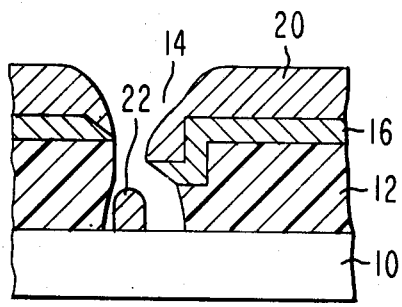

The structure is blanket irradiated with actinic irradiation to irradiate the portion of the photoresist layer 12 remaining exposed in the recesses 14 in the metallization layer 16. The irradiation dosage is sufficient so that the photoresist layer 12 will be developed to the substrate 10 as illustrated in FIG. 3. The structure is suitably developed with a developer that is recommended by the manufacturer. Development is extended for a period of time sufficient to cause some undercut of the metallization layer 16. The amount of undercut should be sufficient to provide for subsequent lift-off of the photoresist layer 12, but not sufficient to cause distortion of the thin layer of metallization 16. The determination of a proper development time to accomplish these objectives is considered to be within the purview of one of ordinary skill in the art.

A second, thicker layer of metallization 20 is then deposited at normal incidence over the structure, suitably by evaporation. The layer of metallization 20 is typically aluminum, an alloy thereof with silicon or silicon and copper, chromium, a titanium/platinum/gold alloy and the like. The thickness of the second layer of metallization cannot be so great as to prevent that deposited on the first layer of metallization 16 from separating from that deposited on the substrate 10. It is necessary that the deposits 22 of second metallization on the substrate 10 separate from that deposited on the first layer of metallization 16 in order that a lift-off solvent can reach the substrate to remove the photoresist structure. Typically, the second layer of metallization is from about 400 to 700, suitably about 500, nm thick.

Figure 5:
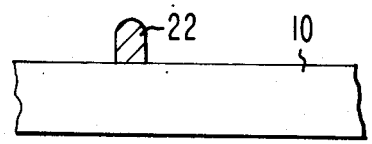

The structure is then immersed in a suitable organic solvent to separate the photoresist layer 12 from the substrate 10 so that the entire overlying structure can be removed, i.e. lifted off, leaving the sub-micrometer deposit of second metallization 22 on the substrate 10 as shown in FIG. 5.

The subject invention provides a simplified, reproducible process of providing sub-micrometer metallization structures on a substrate utilizing a single layer of photoresist and relatively few processing operations.

The invention has been described with reference to preferred embodiments thereof. It will be appreciated by those skilled in the art that various modifications may be made from the specific details given without departing from the spirit and scope of the invention.

I claim:

1. A process for forming on a substrate a patern of metallization significantly finer than the resolution capability of a photoresist material utilizing a single layer of photoresist comprising:
   (a) forming a single layer of a positive photoresist on the substrate;
   (b) pattern irradiating the photoresist layer with a dosage of actinic radiation such that, upon development, the irradiated pattern of the photoresist layer will be only partially removed;
   (c) developing the irradiated photoresist layer, thus forming recesses which extend only partially through the thickness of the photoresist layer;
   (d) depositing a first layer of metallization onto the irradiated and developed photoresist layer at an oblique angle such that it does not completely cover said recesses;
   (e) flood irradiating the portion of the photoresist layer not covered by the first layer of metallization, said portion lying within the recesses with actinic radiation and developing by removing said portion of the photoresist layer whereby openings are formed in the recesses of the photoresist layer which extend to the substrate;
   (f) depositing a second layer of metallization over the substrate and first layer of metallization, wherein the metallization deposited on the substrate through said openings separates from that deposited on the first layer of metallization;
   (g) contacting the photoresist layer with an organic solvent capable of separating the irradiated, developed and metallized photoresist layer from the substrate; and
   (h) removing the layer of photoresist and metallization deposited thereover from the substrate leaving the second layer of metallization deposited in the openings.

2. A process in accordance with claim 1, wherein the substrate is gallium arsenide.

3. A process in accordance with claim 1, wherein the photoresist is a novolac resin/diazoquinone sensitizer-based photoresist.

4. A process in accordance with claim 1, wherein a photoresist composition is spin-coated onto the substrate, dried and soft-baked to form the layer in step (a).

5. A process in accordance with claim 1, wherein development in step (c) removes from about 25 to 50 percent of the thickness of the photoresist layer.

6. A process in accordance with claim 5, wherein development in step (c) removes about 30 percent of the thickness of the photoresist layer.

7. A process in accordance with claim 1, said process additionally including the step of treating the surface of the photoresist layer with a fluorocarbon plasma prior to deposition of the first layer of metallization.

8. A process in accordance with claim 1, wherein the first layer of metallization is nickel.

9. A process in accordance with claim 1, wherein the first layer of metallization is titanium.

10. A process in accordance with claim 1, wherein the second layer of metallization is aluminum or an alloy thereof.

* * * * *